United States Patent [19]

Sherwood

[11] 4,415,850
[45] Nov. 15, 1983

[54] GROUND CONDUCTOR MONITORING SYSTEM

[75] Inventor: John R. Sherwood, Arlington, Va.

[73] Assignee: AMF Incorporated, White Plains, N.Y.

[21] Appl. No.: 233,819

[22] Filed: Feb. 12, 1981

[51] Int. Cl.³ .................................... G01R 31/02
[52] U.S. Cl. .................................... 324/51; 361/42
[58] Field of Search ............. 324/51; 361/113, 42, 361/45–50; 340/652

[56] References Cited

U.S. PATENT DOCUMENTS

| | | | |
|---|---|---|---|
| 1,539,834 | 6/1925 | Gaarz | 361/48 |
| 3,713,003 | 1/1973 | Benham | 361/45 |
| 4,001,646 | 1/1977 | Howell | 361/113 X |
| 4,011,483 | 3/1977 | Meadows | 324/51 X |
| 4,053,815 | 10/1977 | Sircom | 361/113 X |
| 4,071,871 | 1/1978 | Kochem | 361/113 X |
| 4,153,923 | 5/1979 | Graf | 324/51 X |
| 4,187,504 | 2/1980 | Cantrell | 340/652 OR |
| 4,191,946 | 3/1980 | Knox | 340/652 X |
| 4,228,475 | 10/1980 | Sherwood | 324/51 X |
| 4,321,643 | 3/1982 | Vernier | 361/48 |

FOREIGN PATENT DOCUMENTS 661416 5/1979 U.S.S.R. ............................. 324/51

OTHER PUBLICATIONS

Forsyth et al.: "The Brookhaven Superconducting Cable Test Facility" IEEE Tran. on Magnetics—Jan. 1977.

Primary Examiner—Gerard R. Strecker
Assistant Examiner—Jose M. Solis
Attorney, Agent, or Firm—David E. Dougherty

[57] ABSTRACT

A monitoring system for continuously monitoring the ground conductor of an electrical cable having power conductors and a pilot wire in addition to the ground conductor. An a.c. test signal is connected onto a loop comprised of the ground conductor and pilot wire and a terminating impedance. A current transformer samples the test signal on the ground conductor and checks its magnitude. By making the transformer impedance considerably lower than the mutual inductance between the ground conductor and pilot wire, large, expensive blocking impedances are not required to prevent the test signal from following sneak paths from the test loop to earth ground.

6 Claims, 8 Drawing Figures

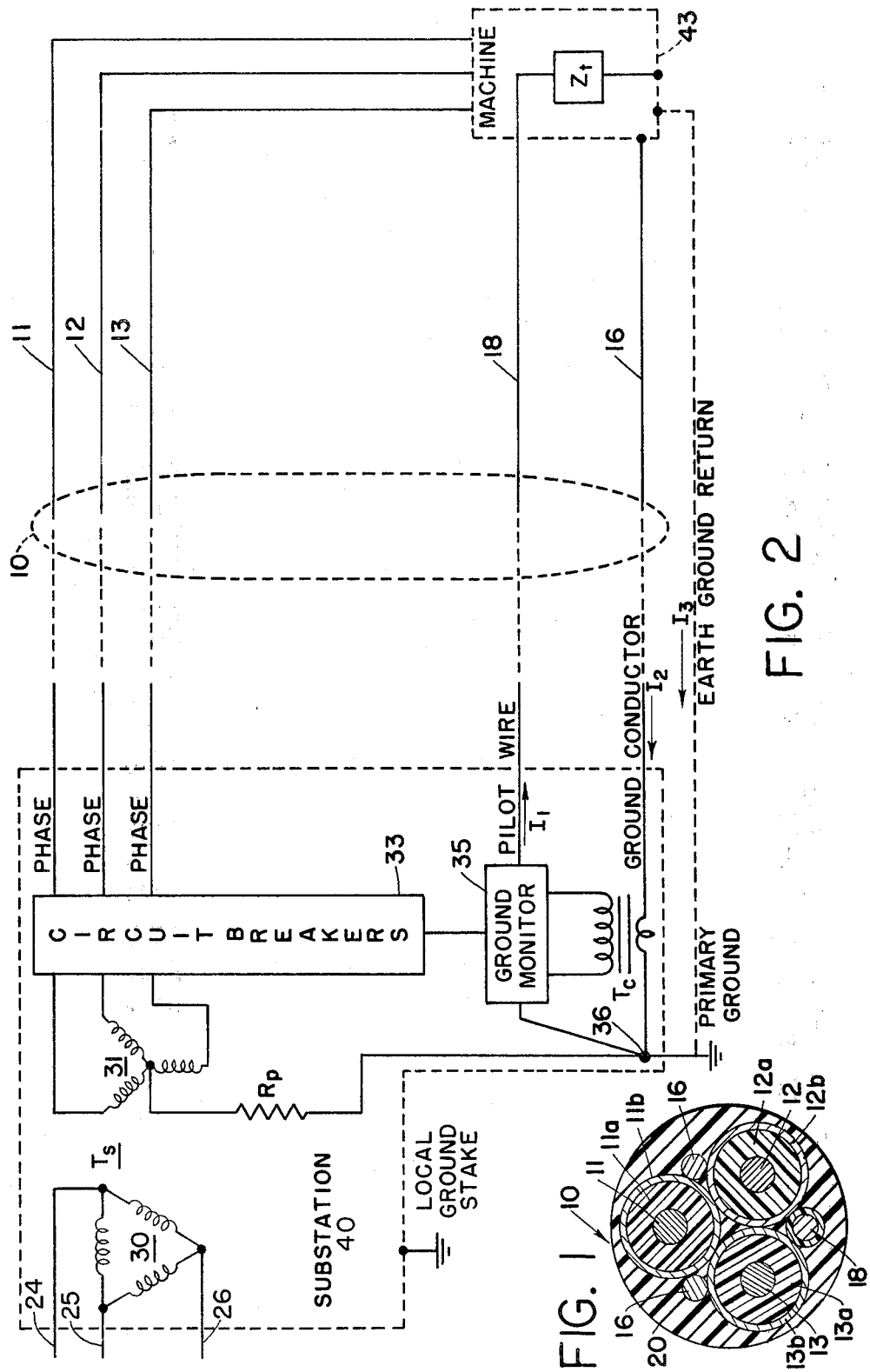

GROUND CONDUCTOR MONITORING SYSTEM

BACKGROUND OF THE INVENTION

This invention relates to a ground monitoring system and more particularly to a system for monitoring the integrity of the ground wire in a multi-wire power cable of a type used in surface mining operations, i.e., strip mines. In surface mining operations, extensive use is made of large electrically powered machinery such as power shovels, pumps, drills, etc. As an example, 600 volt to 25 kilovolt, three phase electrical service may be provided at a remote surface mining site. Electrical utility company power lines are brought to a substation at or close to the mining site. Because much of the mining machinery must be movable, long insulated power cables that can be dragged along the ground connect the machinery to mobile switch houses that in turn are connected to the substation by additional long insulated cables. There are a number of different types of power cables used in surface mining. One such type of cable includes the three power conductors or phase wires, each with a metallic shield around it, two bare ground conductors, and an insulated ground check wire that commonly is called a pilot wire. All are enclosed in an insulating elastomeric jacket. Typically, the cables are in 1,000 or 1,500 foot lengths. Two or more cables, and sometimes up to ten cables are series connected.

If an insulation breakdown occurs in one of the large electrically powered pieces of machinery the entire machine may be at a dangerous high voltage unless it is protected by a suitable metallic ground circuit. In many instances the machine will be in contact with the earth, but because the machinery is moved around from place to place, a dependable earth ground resulting only from contact with the earth cannot be relied upon. Consequently, a metallic ground circuit in the power cable is essential. The Federal Coal Mine Health and Safety Act of 1969 requires that the electrical ground circuit in the power cable be continuously monitored to detect short circuits, open circuits, and abnormally high resistance conditions in the ground circuit. Upon detection of a fault condition the ground monitor must open one or more circuit breakers to disconnect the electrical source from the faulty portion of the system.

A ground monitor intended for use at a surface mining location must be able to detect the desired condition that it is the metallic ground conductor of the power cable that is providing ground continuity in the system and not an earth ground resulting from the machine being in contact with the earth or water.

A system for monitoring the integrity, or continuity, of the ground conductor of an electrical power cable is disclosed in my U.S. Pat. No. 4,228,475, issued Oct. 14, 1980. In that system, corresponding ends of the pilot wire and ground conductor of a power cable are connected together through a terminating resistor Rt. The other ends of the ground conductor and pilot wire are connected to the primary ground of the mining site. A 1 kHz sensing signal is coupled onto the loop formed by the pilot and ground conductors. The ground sensing circuit of that patent continually monitors the loop and produces a fault indication when the resistance "seen" by the sensing circuit increases by more than two ohms from the value of the terminating resistance Rt. An objective in that system was to assure that the sensing signal in the loop was not diverted through any sneak paths to earth ground at a switch house, splice skids, and machinery frames, for example. To isolate the pilot wire and ground conductor loop from potential sneak paths, a large blocking impedance in the form of a large iron core inductor was connected in series with the ground conductor just beyond the junction with the terminating resistor Rt. In U.S. Pat. No. 4,321,643, issued Mar. 23, 1982 to R. Vernier, the blocking impedance is located in the line that connects to the local ground stake rather than in series with the cable ground conductor or conductors.

The ground conductor monitoring system disclosed in my above mentioned patent performs well to achieve its desired purpose, but does have several disadvantages. The blocking impedance is quite expensive, is difficult to install on equipment in the field, and is not fail-safe because it appears as a high impedance to the sensing signal whether it is functioning as intended or is faulty because it has an open circuit therein.

Another shortcoming of the system disclosed in my above mentioned patent results from the fact that the fault sensing circuitry is "looking for" a resistance change of two ohms in the loop formed by the pilot wire and ground conductor. In order for a two ohm change in resistance to appear to be significant and thus easily detected, the total resistance in the loop must be a low value. This means that the impedance in the ground sensing circuitry that is in series with the loop has to be as small as possible. This consideration severely restricts the use of noise suppressing and transient suppressing circuit means in the fault sensing circuitry. Because of the restriction on the use of noise suppressing means, the fault sensing circuitry of my previous system was to some extent susceptible to damage and destruction of components due to noise and transients.

SUMMARY OF THE INVENTION

Quite contrary to my previous thinking, I have discovered that it is not necessary to use blocking impedances to isolate the monitored pilot wire and ground conductor from potential sneak, or parallel, paths to earth ground. Theoretical analysis shows, and actual use confirms, that a monitoring system for a cable can function without the blocking impedances and can in fact operate with improved results as compared with my prior system.

Additionally, the ground sensing monitor of my present invention is not "looking for" a two ohm resistance change in the monitored loop comprised of the pilot wire and ground monitor. The present system is looking, in one instance, only for a change in the magnitude of the test signal current from some nominal or predetermined value. This is an important consideration because it means that the above-mentioned restriction on adding impedance to the monitored loop no longer is present and I now am able to add additional noise and transient suppression means to the fault sensing circuitry.

BRIEF DESCRIPTION OF THE DRAWINGS

The invention will be described in connection with the accompanying drawings wherein:

FIG. 1 is a cross sectional illustration of a type of cable that is used in practicing the present invention;

FIG. 2 is a simplified illustration of an electrical power distribution system employing a cable of the type illustrated in FIG. 1 and incorporating the improved ground cable monitoring features of this invention;

DETAILED DESCRIPTION OF THE INVENTION

Figure 3:
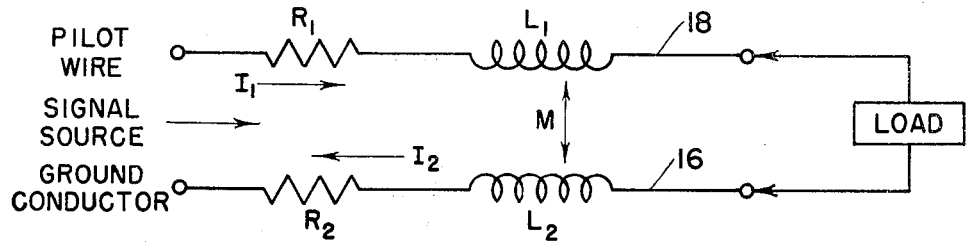
FIGS. 3-7 are schematic illustrations used in explaining the circuit theory that forms a basis for the improvement of this invention.

Before explaining the principle of this invention, the type of electrical power cable that may be employed in the power distribution system at a surface mining operation first will be described. The type of cable chosen for representation is identified as SHD-GC-8 KV to 25 KV. Other types are available, but the above-identified type is represented in FIG. 1 and used as the example throughout this description. In FIG. 1, the individual phase wires 11, 12, and 13 are stranded metallic conductors and each is surrounded by respective insulating material 11a, 12a, and 13a, and by a respective stranded conductive shield 11b, 12b, and 13b. The cable also includes two bare stranded ground wires 16, and an insulated stranded ground check, or pilot wire 18. A jacket or sheath 20 of elastomeric insulation material surrounds all the conductors and wires. Although the cable actually includes two ground conductors 16, they and the shields 11b, 12b, and 13b function as a system ground conductor. Accordingly, in the following discussion and in the accompanying schematic drawings, just one ground conductor will be illustrated, it being understood that in practice it may be a number of conductors and shields.

A simplified illustration of an electrical power distribution system that might be used at a surface mining site is illustrated in FIG. 2. High voltage from the electric utility company three phase system is coupled over open wires 24, 25, 26 to the delta connected primary windings 30 of transformer $T_s$ at the substation 40. The substation structure is grounded by a local ground stake, as indicated. The secondary winding 31 of transformer $T_s$ is wye connected and its neutral point is connected through resistor $R_p$ to the primary ground of the mining site power distribution system. Resistor $R_p$ is a current limiting resistor that is intended to limit the magnitude of any ground fault current to no more than 50 amps.

Substation 40 includes large circuit breakers 33 in each of the phase wires 11, 12 and 13 of cable 10 of the mine power distribution system. The circuit breakers operate to open the phase wires upon detection of a fault in the grounding system by the fault sensor circuit 35. The circuit breakers also operate to open the phase wires upon detection of an over-current, in the conventional manner. The cable ground conductor 16 and ground monitor are grounded at point 36 to the primary ground of the substation. As illustrated, the ground monitor or fault sensor circuit 35 is coupled between pilot line 18 and ground point 36.

Cable 10 extends to a distantly located machine 43 such as a drill, shovel, etc. At machine 43 ground conductor 16 and pilot wire 18 are terminated in an impedance $Z_t$. It is seen that a ground cable test loop is formed by ground conductor 16, terminating impedance $Z_t$, pilot wire 18 and ground monitor 35.

In a cable of the type illustrated in FIG. 1, i.e., the cable that extends between substation 40 and machine 43 in FIG. 2, there is mutual coupling between the wires of the cable. The mutual inductance M between the wires may be expressed as follows.

$$M = 0.00508 \, L \left( 2.203 \log_{10} \frac{2L}{D} - 1 \right),$$

where D is the distance between the wires, and L is the length of the wires, the length L being much greater than the distance D. M is in microHenries. In a cable of the type under consideration the pilot and ground conductors are close together so that D is small. On the other hand, the distance D between the pilot wire and an earth ground return path will be greater than the distance beween the pilot and ground conductors of the cable. Consequently, the mutual inductance M between the pilot and ground conductor of the cable is greater than that between the pilot wire or ground conductor and the earth ground return path.

Figure 4:
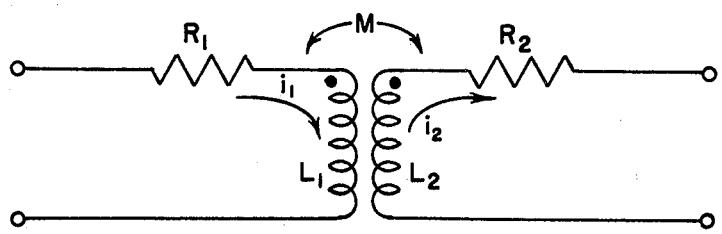

The mutually coupled pilot wire 18 and ground conductor 16 of a cable of the type illustrated in FIGS. 1 and 2 are schematically illustrated in FIG. 3. $R_1$, $L_1$, and $R_2$, $L_2$ are, respectively, the resistance and inductance of the pilot wire and ground conductor, and M is the mutual inductance between the two. $I_1$ is the current in the pilot wire and $I_2$ is the current in the ground conductor. As is well known in circuit theory, mutually coupled wires may be considered as an air core transformer. Accordingly, the representation in FIG. 3 of the mutually coupled wires also may be represented as an air core transformer, as shown in FIG. 4. It also is well known in circuit theory that an equivalent circuit for the air core transformer is a T network of the type illustrated in FIG. 5, (see Electrical Engineering Science, page 523, by Clement and Johnson, McGraw Hill Book Co.). Because the currents in the pilot wire and ground conductor are in opposite directions, the mutual inductance is negative (−M).

Figure 5:
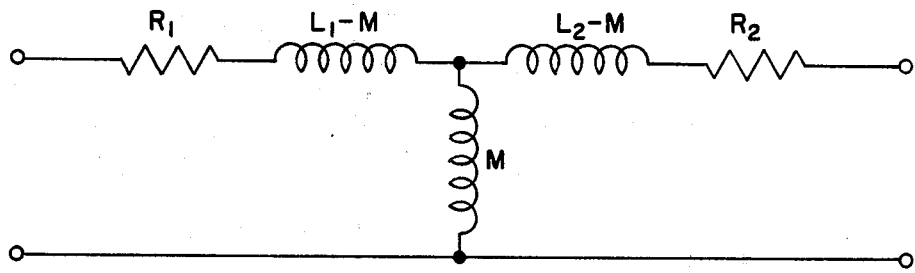
Figure 6:
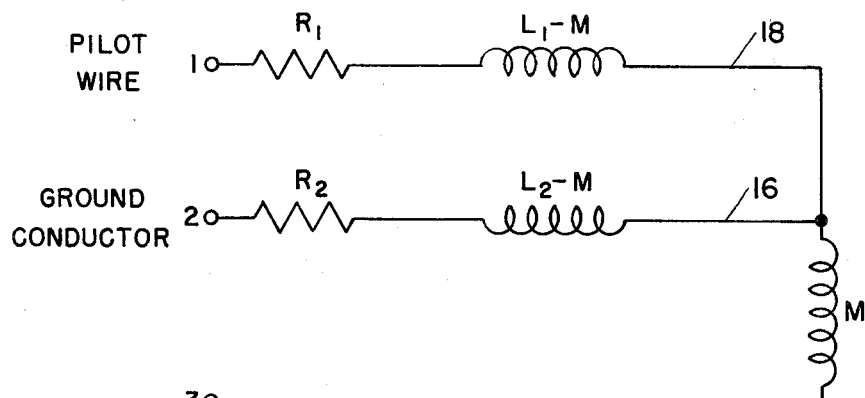
Figure 7:
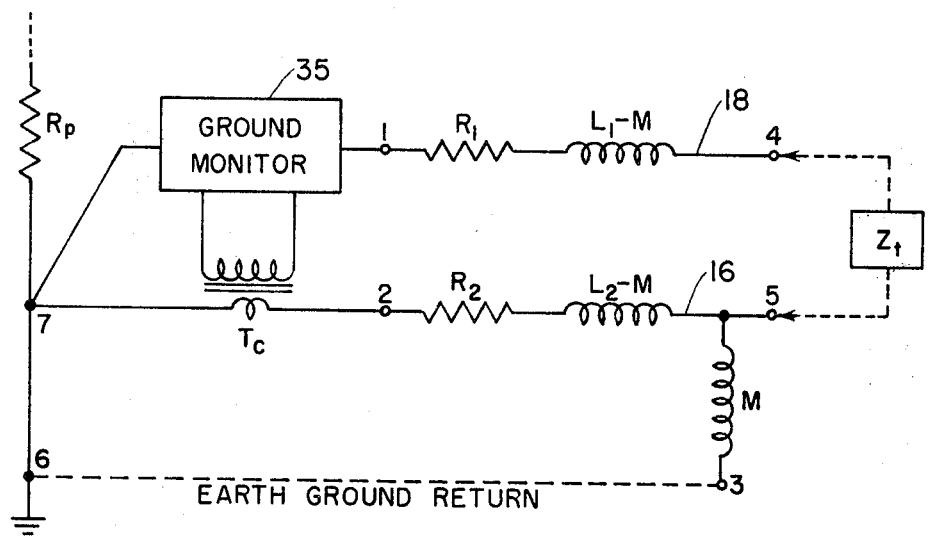

The circuit of FIG. 5 may be redrawn to the circuit of FIG. 6 to make it look more like the pilot and ground conductors of the cable 10. Carrying the representation of FIG. 6 into the grounding system of the surface mine electrical distribution system of FIG. 2, and illustrating only the ground conductor monitoring loop, results in the simplified illustration of FIG. 7. It is seen that the impedance component due to the mutual inductance M is subtracted (actually 2M is subtracted) from the impedance of the ground sensing loop comprised of pilot wire 18 and ground conductor 16, i.e., points 1, 4, 5, 2, 7, FIG. 7, but is included in the earth ground return path, i.e., points 1, 4, 5, 3, 6.

Representative values of circuit parameters for a cable of the type mentioned above are as follows.

$L_1 = 393$ microHenries
$L_2 = 282$ microHenries
$M = 268.5$ microHenries
$R_1 = 0.26$ ohms
$R_2 = 0.10$ ohms In practice, at 1 kilohertz, the effective impedance value of the mutual inductance was measured to be approximately 1.8 ohms for a 1,000 feet length of cable. The minimum value of contact resistance that one might expect between a switch house and earth is of the order of two ohms, and in practice probably will be even larger. With the parameter values given above it is seen that the impedance between terminals 1 and 2 is much smaller than the impedances between terminals 1 and 3, or between terminals 2 and 3. This means that even if the earth ground has zero impedance the ground conductor of the cable still will be a lower impedance current path than the earth ground return path that has the mutual inductance M in series with it. In one actual example, the measured value of impedance between terminals 3 and 5 of FIG. 7 was 18 times greater than the measured value of impedance between terminals 2 and 5. It will be remembered that the ground conductor 16 of FIG. 7 actually is two braided ground wires and the braided shields of the phase wires. Consequently, the resistance of the path between points 2 and 5 will be less than the resistance between points 1 and 4 and between 5 and 6. Assuming negligible impedance in the primary of transformer $T_c$, less than $5\frac{1}{4}\%$ of the current on the ground monitor loop would flow through the earth ground return path even if it had zero impedance.

Based on my above analysis I made the discovery that with the design of my present system I do not need the large and expensive blocking impedances $Z_b$ that are included in the ground monitoring system of my above mentioned patent since the leakage current that was being blocked actually was small enough to ignore.

Figure 8:
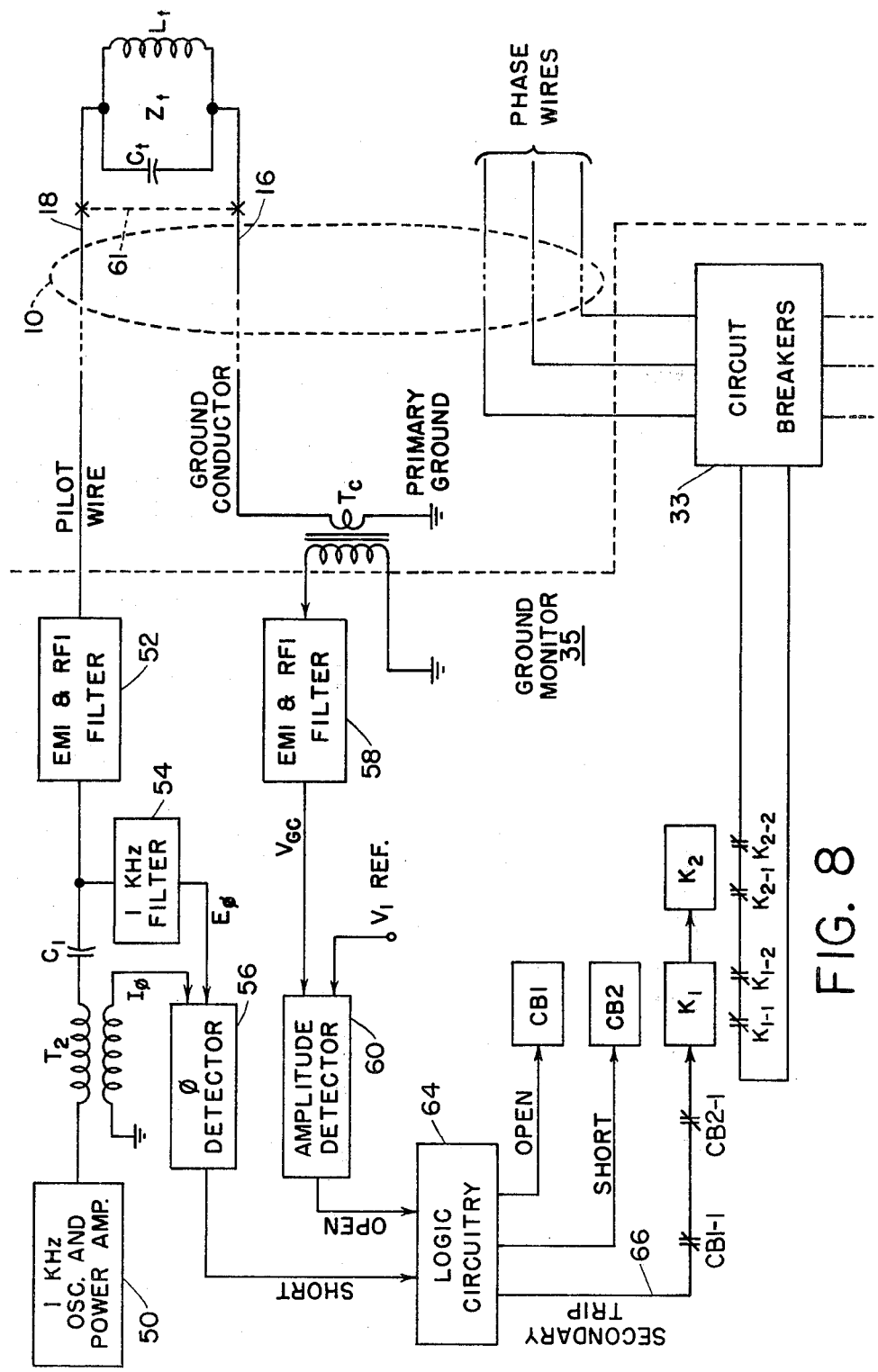
FIG. 8 is a simplified diagram that illustrates the features of the ground conductor monitor of this invention.

A ground conductor monitoring system according to my present invention is illustrated in simplified form in FIG. 8. Ground monitor 35 includes an oscillator and power amplifier 50 that produces a 1 kiloHertz test signal. The signal passes through a 1 KHz series resonant filter comprised of the primary winding of transformer $T_2$ and capacitor $C_1$. The signal is further filtered in an EMI and RFI filter 52 which provides transient and voltage spike suppression. The thoroughly filtered test signal then is directly connected to pilot wire 18 of the mine power cable 10.

Pilot wire 18 and ground conductor 16 are connected together by a terminating impedance Zt at the far end of the cable where a machine is located. Terminating impedance $Z_t$ is comprised of the parallel connected capacitor $C_t$ and the inductor $L_t$. A test loop therefore is formed by pilot wire 18, ground conductor 16, terminating impedance $Z_t$, and monitor 35.

The 1 kHz current that flows to pilot wire 18 is sampled by sampling transformer $T_2$. The current from the secondary of transformer $T_2$ is coupled as the $I\phi$ input to phase detector 56. The other input to phase detector 56 is a voltage sample $E\phi$ of the 1 kHz test signal that is connected to pilot wire 18. The voltage sample $E\phi$ is filtered by a 1 kHz parallel resonant filter 54. Because the current sample signal $I\phi$ is coupled through transformer $T_2$, the input signals $I\phi$ and $E\phi$ to phase detector 56 are in phase quadrature. The 1 kHz parallel resonant filter 54 filters 60 Hertz signals and transients. Filter 54 introduces a minimal phase shift of not more than 10 degrees over the operating voltage and temperature ranges.

The operating principle underlying the above mentioned phase comparison is as follows. Under normal conditions the combined reactance of the ground conductor 16 and pilot wire 18 of the type of cable under consideration is inductive. The reactance at 1 kHz of terminating impedance Zt is capacitive, being about 10 microfarads in one embodiment of the invention. The inductance element $L_t$ provides a low impedance, high current carrying path at 60 Hz. At 60 Hz, terminating impedance Zt appears as a 2.5 milliHenry inductor. This prevents high voltage build-up on the pilot wire in the event of a phase wire to pilot wire short, and also assures that the phase wire current will not be limited, thereby assuring that the circuit breaker will trip on an overcurrent.

Even with as many as ten 1,000 foot cables connected in series, the reactance of terminating impedance Zt at 1 kHz will appear to be capacitive to ground monitor 35 if the ground conductor monitoring loop is in acceptable condition.

If a short circuit exists between ground conductor 16 and pilot wire 18, as illustrated at 61 in FIG. 8, ground monitor 35 no longer will "see" the capacitive reactance of terminating impedance Zt but will "see" the inductive reactance of the conductors 16 and 18. Phase detector 56 senses this change from a negative to a positive reactance and produces a fault signal in response thereto.

The current of the 1 kHz test signal flowing in ground conductor 16 of cable 10 is sampled by current transformer Tc that is located at the ground monitor end of cable 10, i.e., remote from the machinery. The primary of this transformer is a straight conductor that is series connected to the cable ground conductor 16. The secondary winding is comprised of multiple windings on a ferromagnetic toroid that encircles the straight primary wire. Because the primary winding of transformer Tc is a straight conductor, its impedance will be negligible compared with the actual value of the mutual inductance M. This is consistent with the theory and explanation given above in connection with FIGS. 3–7.

The sampled ground conductor current $I_{gc}$ is coupled to EMI and RFI filter 58 which functions to reject 60 and 120 Hertz signals and provides transient and voltage spike protection. This filtered ground conductor current sample $I_{gc}$ then is coupled to amplitude detector 60 where it is compared with a reference voltage $V_{1ref}$. If the ground conductor monitoring loop is in acceptable operating condition the voltage Vgc corresponding to current $I_{gc}$ is greater in magnitude than the reference voltage $V_{1ref}$ and the output of comparator 60 will be high. If an open circuit or high resistance fault condition exists in the ground conductor monitoring loop, the current in the loop will fall and voltage $V_{gc}$ will be smaller in magnitude than reference voltage $V_{1ref}$. With this condition, comparator 60 will produce a fault signal, which in one embodiment is a low signal.

The use of the current sensing transformer $T_c$ for monitoring the current of the test signal on ground conductor 16 provides a number of advantages. First, it is failsafe in that if the test current is bypassed around the transformer or if the transformer should become open circuited in its primary or secondary, the output of the transformer will fall and a fault signal will be produced by amplitude detector 60. Additionally, because the primary of transformer is a straight conductor with substantial current carrying capacity, the use of transformer Tc does not appreciably increase the impedance to 60 Hz current. The system of this invention also may be used in a power distribution system that is carrying d.c. power.

As further illustrated in FIG. 8, the outputs of phase detector 56 and amplitude detector 60 are coupled to logic circuitry 64 which responds to a fault signal on either of its inputs to produce a corresponding output signal that actuates a respective one of the circuit breakers CB1 or CB2. In response to an open circuit fault signal or a short circuit fault signal logic circuitry 64 also produces a secondary trip signal on output line 66. Secondary trip line 66 includes the two contacts CB1-1 and CB2-1 of circuit breakers CB1 and CB2. These contacts are closed, as illustrated, when the circuit breakers are set and a respective one of the contacts opens when a fault signal is coupled from logic circuitry 64 to one of the circuit breakers CB1 and CB2. Secondary trip line 66 is energized in the absence of a fault condition on the ground conductor monitoring loop and the coils of relays K1 and K2 normally are energized. The energization of these relay coils causes contacts K1-1, K1-2 and K2-1, K2-2 to be closed. The closed contacts energize a holding coil, or coils, in the cable circuit breakers to connect the phase wires of cable 10 to the substation. Upon occurrence of a fault signal from logic circuitry 64, circuit breaker CB1 or CB2 is tripped to open a corresponding set of contacts CB1-1 or CB2-1 to open secondary trip line 66. Additionally, secondary trip 66 is deenergized upon occurrence of a fault signal to logic circuitry 64. Consequently, relay coils K1 and K2 are deenergized and their corresponding contacts K1-1, K1-2 and K2-1 and K2-2 open to deenergize the holding coil of the cable circuit breakers, thereby causing them to open and disconnect cable 10 from the substation.

The particular circuitry that is included in logic circuitry 64 may be conventional and may be similar to that illustrated in FIGS. 4 and 5 of my above identified patent, and as in FIGS. 4 and 5 of the above-mentioned Vernier patent. In the accompanying FIG. 8, phase detector 56 would include the signal path comprised of squaring amplifiers 111, 112 exclusive or circuit 113, and integrator R18 C18 of my above identified patent. Amplitude detector 56 of the accompanying FIG. 8 may be a conventional comparator used similarly to corresponding devices in my prior patent. Similarly, the secondary trip signal on line 66 may be produced in a manner similar to the secondary trip signal on line 187 in FIG. 4 of my above-mentioned patent. In the present invention, the open and short signals from amplitude detector 60 and phase detector 56 would be input signals, along with power-up and power-down signals commonly used in logic circuitry. If additional details are desired, reference is made to FIGS. 4 and 5 of my prior patent, although one skilled in the art will be fully capable of instrumenting the block diagram illustrated in the accompanying FIG. 8.

The value of the comparison voltage $V_{1ref}$ that constitutes one input to amplitude detector 60 need not be an exact value but is selected to produce acceptable operation with the length of cable contemplated to be used.

From the above description it may be understood that a simplified and more reliable ground fault monitor is possible as a result of the realization that the mutual inductance in the cable reduces the impedance of the test loop comprised of the pilot wire 18 and ground conductor 16 so that the impedance of that loop to the test signal inherently will be less than the impedance of a circuit that includes an earth ground return path. Realization of this concept allows me to eliminate the costly and cumbersome blocking impedances that were previously believed to be necessary in order to isolate the test loop from possible sneak parallel paths to ground.

In situations where a length of cable or cables is connected to another length of cable or cables at a splice skid or cable coupler, as is customary, the above discussed teachings will hold since the contact resistance to earth of a splice skid, for example, is expected to be in excess of two ohms. If it is desired to be extra cautious, a blocking impedance may be used at the splice skid to connect the ground conductor 16 to the splice skid housing (ground), in the manner discussed in the Vernier patent.

I claim:

1. The method of monitoring the condition of the ground conductor of an electrical power cable that also includes a plurality of power or phase wires and at least one other wire, all of which extend from one end to the opposite end of the cable, said method comprising the steps earth grounding said ground conductor only at said one end, coupling an a.c. test signal between said one end of the ground conductor and the corresponding end of said other wire, terminating the ground conductor and the other wire at said opposite end of the cable in an impedance that presents at least a predetermined capacitive reactance at the test signal frequency when monitored at said one end of the cable, monitoring the reactance of said terminating impedance and producing a fault signal when the reactance of the cable as monitored at said one end changes from said predetermined capacitive reactance, sampling the test signal current flowing in said ground conductor at said one end of the cable, and producing a fault signal when the sampled test signal current is below a predetermined magnitude.

2. The method claimed in claim 1, wherein said step of sampling the test signal current flowing on said ground conductor comprises sampling the test signal with a transformer that presents an impedance to the test signal that is small compared to the impedance presented by the mutual inductance between said ground conductor and said other wire at the frequency of said test signal.

3. Apparatus for monitoring the condition of a ground conductor that extends throughout the length of an electrical cable that has a plurality of power carrying wires and at least one other wire, said apparatus comprising means at one end of said ground conductor for earth grounding said ground conductor, said ground conductor having no other earth grounding means connected thereto in the absence of a fault condition, an a.c. test signal source coupled between said one end of the ground conductor and a corresponding end of said other wire, impedance means connected between the opposite ends of the ground conductor and said other wire to form a ground monitoring loop, said impedance means having a reactance value at the frequency of said test signal that is opposite to, and greater in magnitude than, the reactance value of said ground conductor and other wire without the impedance means connected thereto, means at said one end of the cable for sampling the voltage and current of the test signal that is coupled onto said monitoring loop, means for comparing the phases of said sampled voltage and current and for producing a fault signal when the comparison indicates that the reactance of the monitoring loop changes from the reactance value of a properly operating monitoring loop with the terminating impedance connected therein, means at said one end of the ground conductor for sampling the test signal current flowing thereon, said last-named means for sampling the test signal current flowing on said ground conductor presenting an impedance to said test signal that is small compared to the impedance represented by the mutual inductance between said ground conductor and other wire at the frequency of said test signal, and means for producing a fault signal when the test signal current sampled on the ground conductor is different from a predetermined magnitude.

4. Apparatus for monitoring for short circuits on a ground conductor that extends throughout the length of an electrical cable that has a plurality of power carrying wires and at least one other wire, said apparatus comprising means for earth grounding said ground conductor only at one end thereof, said ground conductor having no other earth grounding means connected thereto an a.c. test signal source coupled between said one end of the ground conductor and the corresponding end of said other wire, terminating impedance means connected between the opposite ends of the ground conductor in said other wire to form a ground monitoring loop on which said test signal propagates, said impedance means presenting at the frequency of said test signal a reactance value that is opposite to, and greater than, the reactance value of said ground conductor and said other wire without the impedance means connected thereto means at said one end of the cable for sampling the voltage and current of the test signal that is coupled onto said monitoring loop from said test signal source, means for comparing the phases of said sample voltage and current and for producing a fault signal when the comparison indicates that the reactance of the monitoring loop changes from the reactance value of a properly operating monitoring loop with the terminating impedance connected therein.

5. The combination claimed in claim 4 wherein said terminating impedance comprises a parallel connected capacitor and inductor;

said inductor presenting a low enough value of impedance at the frequency of the electrical power carried on said power wires that current undesirably flowing from a power wire to said ground conductor will not be impeded to the extent that the operation of overcurrent circuit breakers in the power wires will be prevented from tripping upon occurrence of said undesired current flow.

6. The combination claimed in claim 5 wherein said terminating impedance presents a capacitive reactance at the frequency of said test signal, said capacitive reactance being greater than the combined inductive reactance of of the ground conductor and said other wire at the frequency of said test signal.

* * * * *